(12) United States Patent
Liu

(10) Patent No.: US 10,228,416 B2
(45) Date of Patent: Mar. 12, 2019

(54) TESTING INTEGRATED CIRCUIT, TESTING METHOD AND ELECTRONIC DEVICE

(71) Applicant: Realtek Semiconductor Corp., HsinChu (TW)

(72) Inventor: Yang-Tang Liu, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 15/336,762

(22) Filed: Oct. 27, 2016

(65) Prior Publication Data

US 2018/0120375 A1    May 3, 2018

(51) Int. Cl.
*G01R 31/28* (2006.01)
*G06F 19/00* (2018.01)
*G06F 3/01* (2006.01)

(52) U.S. Cl.
CPC ..... *G01R 31/2884* (2013.01); *G01R 31/2825* (2013.01)

(58) Field of Classification Search
CPC .......... G01R 31/2884; G01R 31/2825
See application file for complete search history.

(56) References Cited

U.S. PATENT DOCUMENTS

| | | | |
|---|---|---|---|
| 2013/0041612 A1* | 2/2013 | Kim | G05B 19/042 702/108 |
| 2013/0240625 A1* | 9/2013 | Hsu | G01R 31/2829 235/438 |
| 2017/0366746 A1* | 12/2017 | Yu | H04N 5/23222 |

* cited by examiner

*Primary Examiner* — Huy Q Phan
*Assistant Examiner* — Zannatul Ferdous
(74) *Attorney, Agent, or Firm* — Winston Hsu

(57) ABSTRACT

An integrated circuit installed in an electronic device having an external connector, including: a monitor circuit and a control circuit. The monitor circuit coupled to the external connector is configured to monitor a code generated from a user's input and inputted via the external connector, the monitor circuit generating a control signal according to the code; and the control circuit coupled to the monitor circuit and at least a circuit block of the electronic device is configured to control the external connector to be coupled to the circuit block according to the control signal; wherein a testing operation is executed in response to a testing signal inputted to the control circuit via the external connector for checking and modifying a status of the circuit block of the electronic device after the external connector is coupled to the control circuit.

14 Claims, 4 Drawing Sheets

TESTING INTEGRATED CIRCUIT, TESTING METHOD AND ELECTRONIC DEVICE

BACKGROUND OF THE INVENTION

1. Field of the Invention

The present invention relates to the field of integrated circuit (IC) testing.

2. Description of the Prior Art

Electronic devices in the post-factory stage only have a few connectors available for consumers which can be seen by a user from the outside, i.e. from the outer case of the electronic device. Amongst these, a High Definition Multimedia Interface (HDMI) connector, a Universal Serial Bus (USB) connector, and an Ethernet connector are common. When the electronic device is malfunctioning, or having errors for unknown reasons, or even when a user simply needs to modify the internal system settings, the manufacturer of the integrated circuit (IC) installed in the electronic device has to solve the problem. Oftentimes removing the outer case is forbidden by the manufacturer of the electronic device. In such scenarios, a user needs to employ a testing method and a corresponding IC that can perform the test via the external connectors without the need for removal of the outer case.

SUMMARY OF THE INVENTION

One of the objectives of the present invention is to provide a testing integrated circuit, a testing method and an electronic device to solve the abovementioned problem.

According to an embodiment of the present invention, an integrated circuit installed in an electronic device having an external connector is disclosed, wherein the IC comprises: a monitor circuit and a control circuit. The monitor circuit coupled to the external connector is configured to monitor a code generated from a user's input and inputted via the external connector, the monitor circuit generating a control signal according to the code; and the control circuit coupled to the monitor circuit and at least a circuit block of the electronic device is configured to control the external connector to be coupled to the circuit block according to the control signal; wherein a testing operation is executed in response to a testing signal inputted to the control circuit via the external connector for checking and modifying a status of the circuit block of the electronic device after the external connector is coupled to the control circuit.

According to an embodiment of the present invention, a method for testing an electronic device comprising an external connector is disclosed, wherein the method comprises: monitoring a code generated from a user's input and inputted via the external connector and generating a control signal according to the code; controlling the external connector to be coupled to a control circuit according to the control signal, wherein the control circuit is coupled to at least a circuit block of the electronic device; and executing a testing operation in response to a testing signal inputted to the control circuit via the external connector for checking and modifying a status of the circuit block of the electronic device after the external connector is coupled to the control circuit.

According to an embodiment of the present invention, an electronic device is disclosed, comprising: at least a circuit block, an external connector, and a testing IC, wherein the testing IC comprises a monitor circuit, coupled to the external connector, wherein the monitor circuit is configured to monitor a code generated from a user's input and inputted via the external connector, the monitor circuit generating a control signal according to the code; and a control circuit, coupled to the monitor circuit and the circuit block of the electronic device, wherein the control circuit is configured to control the external connector to be coupled thereto according to the control signal; wherein a testing operation is executed in response to a testing signal inputted to the control circuit via the external connector for checking and modifying a status of the circuit block of the electronic device after the external connector is coupled to the control circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
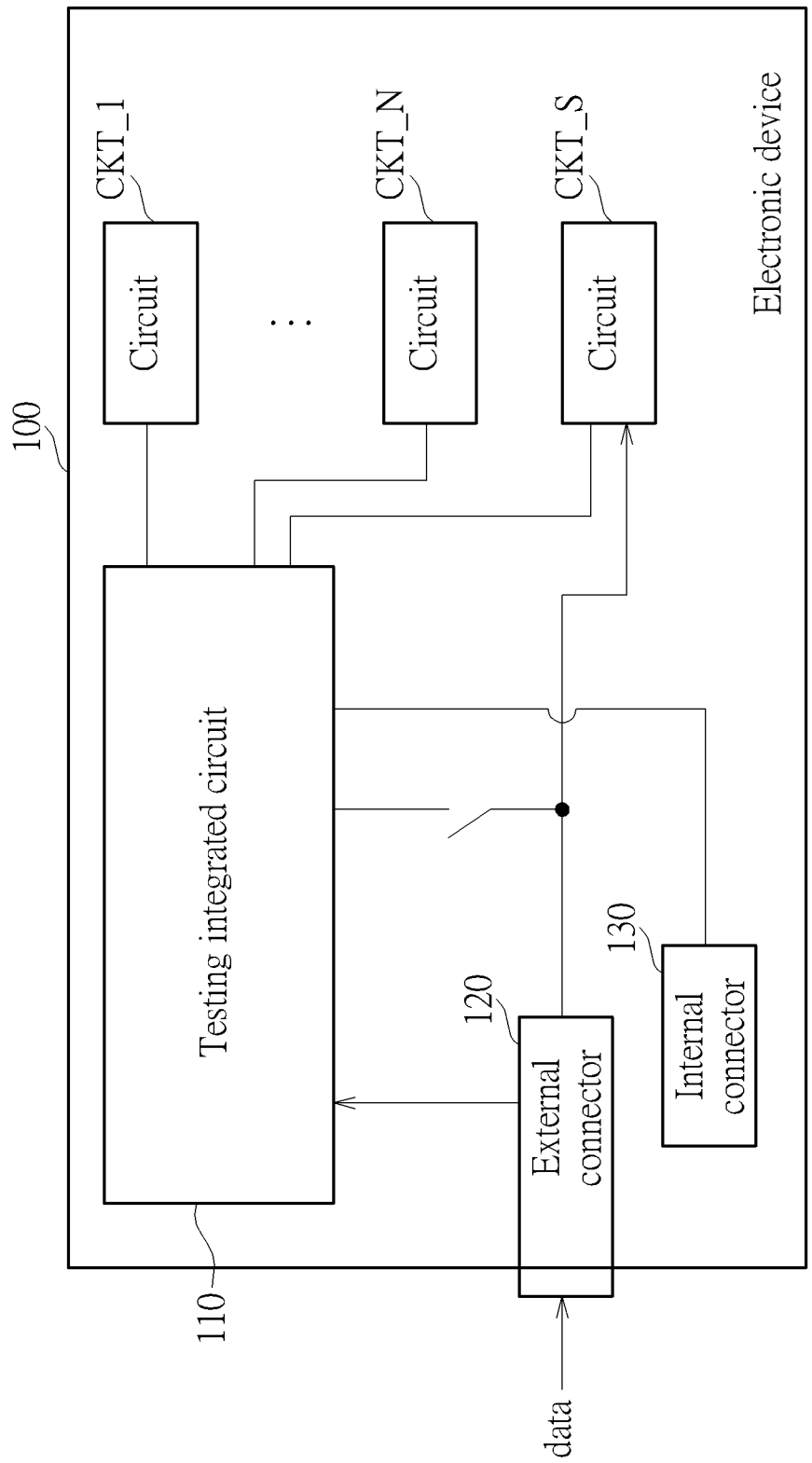
FIG. 1 is a diagram illustrating an electronic device comprising a testing integrated circuit according to an embodiment of the present invention.

FIG. 1 is a diagram illustrating an electronic device 100 comprising a testing integrated circuit 110 according to an embodiment of the present invention. As shown in FIG. 1, the electronic device 100 comprises a testing integrated circuit (IC) 110, an external connector 120 and an internal connector 130. The external connector 120 is the connector available for use by consumers and can be seen from the outer case of the electronic device 100. As mentioned above, the external connector 120 can be a High Definition Multimedia Interface (HDMI) connector, a Universal Serial Bus (USB) connector, or an Ethernet connector, but not limited thereto. Please note that the electronic device 100 can include more than one external connector. For example, the electronic device 100 can include the HDMI connector, the USB connector and the Ethernet connector. FIG. 1 depicts only one external connector for illustrative purposes. The internal connector 130 is a debugging connector which is not available for consumers and cannot be seen from the outer case of the electronic device 100. The internal connector 130 which is originally coupled to the testing IC 110 is arranged for the manufacturer to perform debugging, and it corresponds to a common debug communication protocol, e.g. EJ-tag, Uart, or a USB interface. The electronic device 100 further comprises a plurality of circuit blocks CTK_1-CTK_N which are circuits necessary for the electronic device 100 to perform its normal functions. For example, one of the circuit blocks CTK_1-CTK-N can be a graphic processing unit (GPU) and another one of the circuit blocks CTK_1-CTK-N can be a register or a memory.

The architecture of the plurality of circuit block CTK_1-CTK-N is not limited thereto in the present invention. The present invention focuses on the testing process and the operations of the testing IC 110. When the electronic device 110 normally operates (not under testing), the external connector 120 receives data and transmits the data to a following specific circuit block CKT_S. For example, when the external connector 120 is a HDMI connector, the data is video and image data and the specific circuit CKT_S can be an video and image processing circuit.

Figure 2:
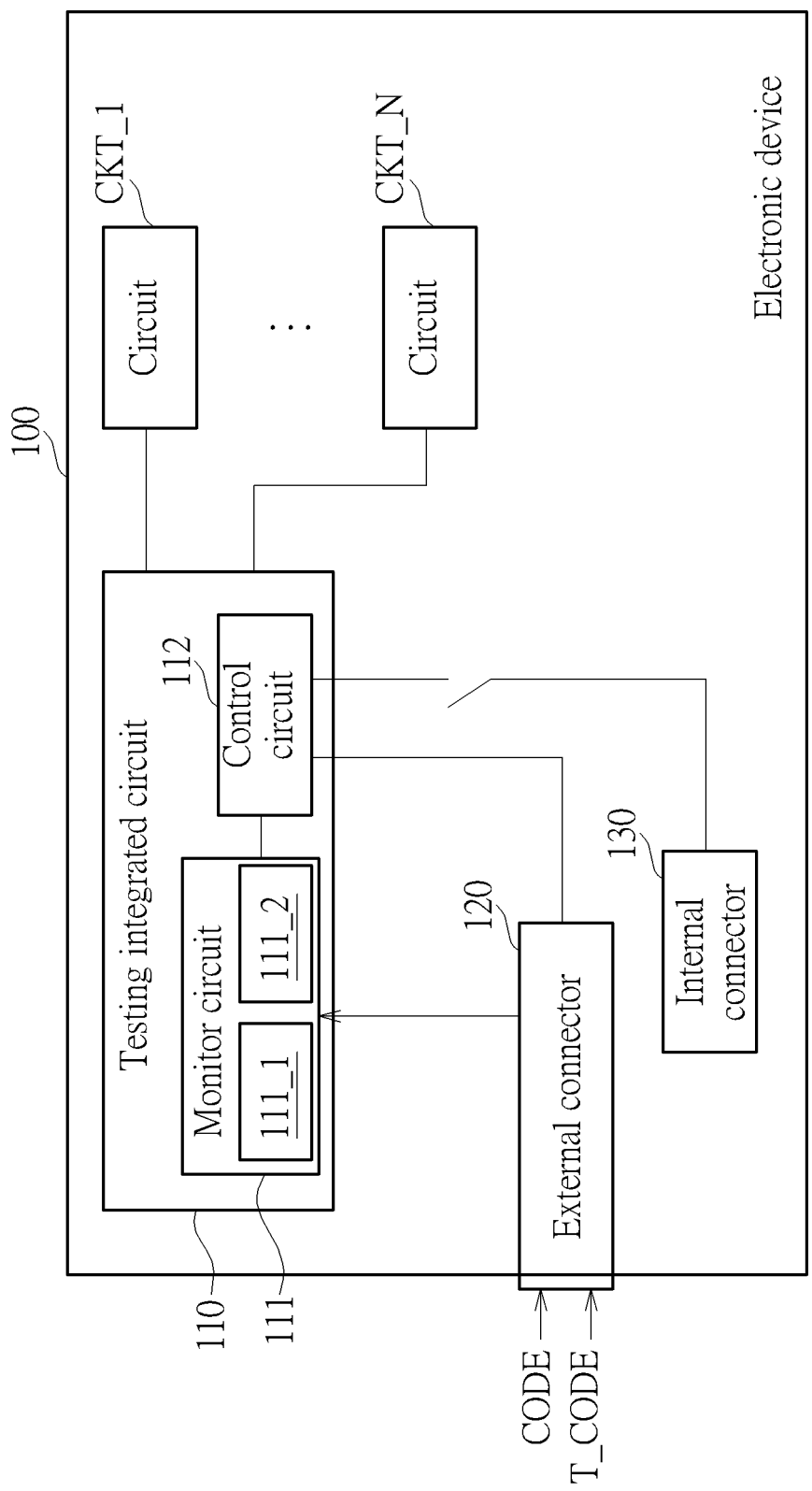
FIG. 2 is a diagram illustrating an electronic device comprising a testing integrated circuit undergoing testing according to an embodiment of the present invention.

FIG. 2 is a diagram illustrating the electronic device 100 comprising the testing integrated circuit 110 while undergoing testing according to an embodiment of the present invention. As shown in FIG. 2, the testing IC 110 includes a monitor circuit 111 and a control circuit 112. The monitor circuit 111 is configured to monitor whether a code passing through the external connector 120 is for testing the electronic device 100. When the code is detected by the monitor circuit 111, a control signal CTRL is generated. Please note that the monitor circuit 111 can be any circuit that achieves the goals of monitoring the code and generating the control signal CTRL. For example, the monitor circuit 111 comprises a decoding circuit 111_1 for decoding the code and a generating circuit 111_2 for generating the control signal CTRL; however, this is only for illustrative purposes, and the present invention is not limited thereto. The control circuit 112 is configured to control the external connector 120 to couple to the plurality of the circuit blocks CKT_1-CKT_N when the control signal CTRL is received, while the connection between the testing integrated circuit 110 and the internal connector 130 is disconnected in order to facilitate the testing process via the external connector 120, instead of the internal connector 130.

Specifically, when the electronic device 100 malfunctions, errors occur for unknown reasons, or the system setting needs to be modified, the user inputs the code through one of a plurality of ports in the external connector 120 for testing. When the monitor circuit 111 detects the code, the control signal CTRL is generated to the control circuit 112. When the control signal CTRL is received, the control circuit 112 disconnects the connection with the internal connector 130 and controls the external connector 120 to couple to the plurality of circuit blocks CTK_1-CTK_N for testing. Furthermore, depending on the item being tested, the user can input a testing signal T_CODE through another port of the plurality of ports in the external connector 120 to achieve the test. For example, the user can input the testing signal T_CODE through another port of the plurality of ports in the external connector 120 to the control circuit 112 for adjusting values in a register. In another example, the user can input the testing signal T_CODE through another port of the plurality of ports in the external connector 120 to the control circuit 112 for overclocking the GPU in the electronic device 100.

Figure 3:
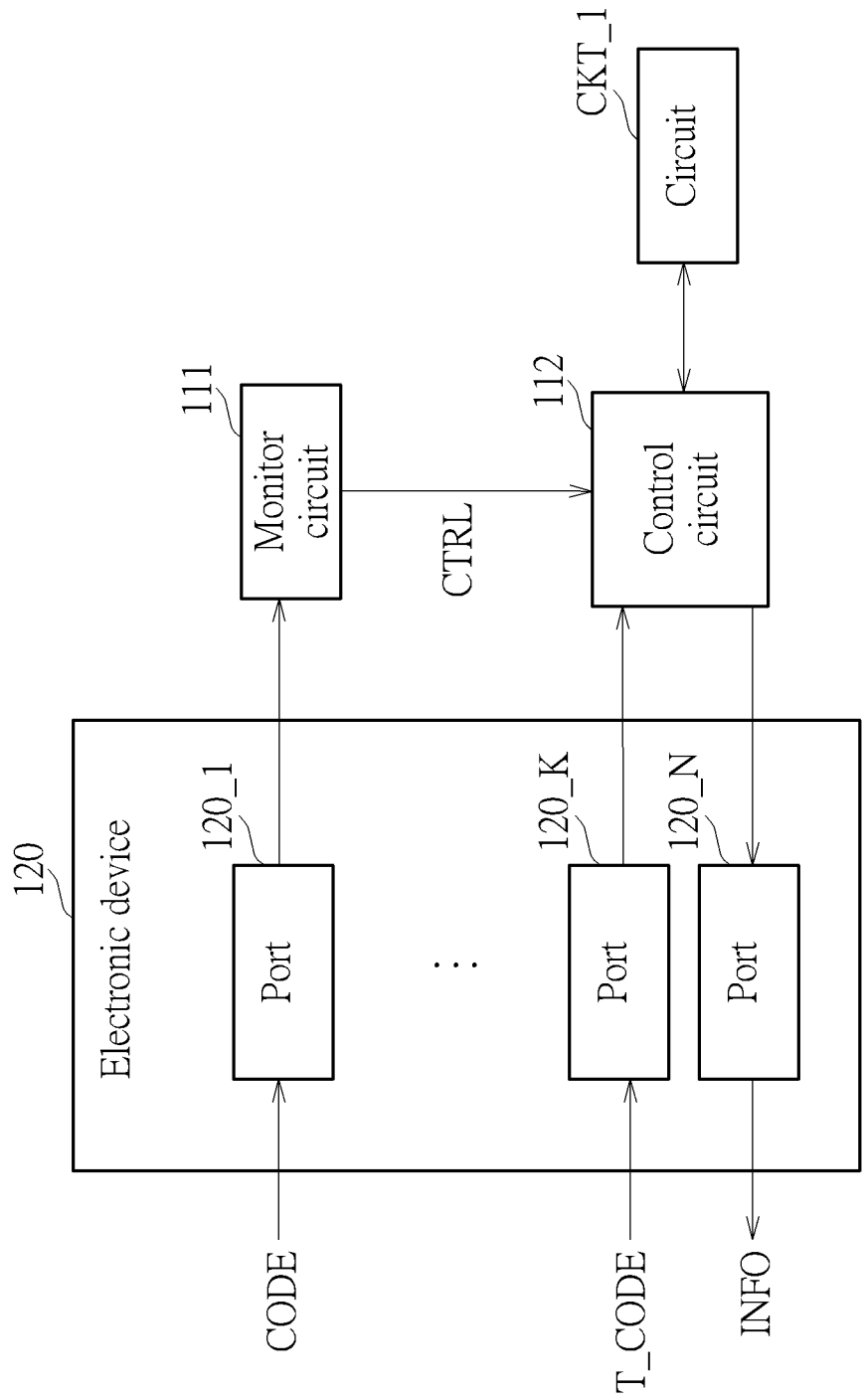
FIG. 3 is a diagram illustrating signals transmitted through an external connector of an electronic device according to an embodiment of the present invention.

FIG. 3 is a diagram illustrating the signals (the code, the testing signal) transmitted through the external connector 120 of the electronic device 100 according to an embodiment of the present invention. As shown in FIG. 3, the external connector 120 comprises a plurality of ports 120_1-120_N, wherein the code for testing the electronic device 110 inputted via one of the plurality of ports (e.g. the port 120_1) is detected by the monitor circuit 111, and the testing signal T_CODE is inputted to the control circuit 112 via another one of the plurality of ports (e.g. the port 120_k). In other embodiments, the user can input the testing signal T_CODE via the port 120_K of the external connector 120 to check a status of a circuit block CKT_1, e.g. the frequency of the GPU, the temperature, etc. The control circuit 112 can output the information INFO (e.g. the frequency or the temperature) through yet another port of the plurality of ports (e.g. the port 120_N) in the external connector 120, and can inform the user by, for example, displaying the information INFO on a screen (the present invention is not limited thereto). It should be noted that the number of ports being used for the code, the testing signal T_CODE or the information INFO is only for illustrative purposes. In other embodiments, the user can inputs the testing signal T_CODE through two (or more than two) of the plurality of ports in the external connector 120, according to the designer's choices.

Figure 4:
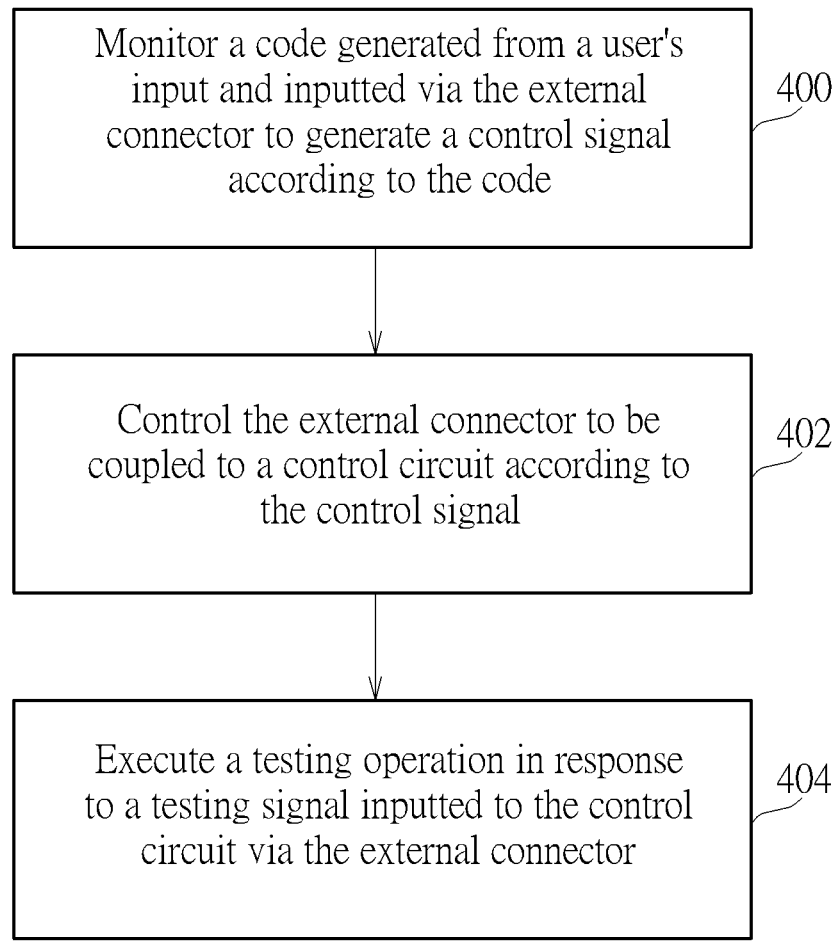
FIG. 4 is a flowchart illustrating a testing method according to an embodiment of the present invention.

FIG. 4 is a diagram illustrating a testing method according to an embodiment of the present invention. Provided that the result is substantially the same, the steps are not required to be executed in the exact order shown in FIG. 4. The exemplary testing method may be summarized by the following steps.

Step 400: monitor a code generated from a user's input inputted via the external connector to generate a control signal.

Step 402: control the external connector to be coupled to a control circuit according to the control signal, wherein the control circuit is coupled to at least a circuit block of the electronic device.

Step 404: executing a testing operation in response to a testing signal inputted to the control circuit via the external connector for checking and modifying a status of the circuit block of the electronic device after the external connector is coupled to the control circuit.

Those skilled in the art should readily understand details of each step shown in FIG. 4 based on the above descriptions directed to the operations of the testing IC 110 shown in FIG. 1. Further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit installed in an electronic device having an external connector and an internal connector, comprising:
   a monitor circuit, coupled to the external connector, wherein the monitor circuit is configured to monitor a code generated externally from a user's input and only inputted via the external connector, the monitor circuit generating a control signal according to the code; and
   a control circuit, coupled to the monitor circuit and at least a circuit block of the electronic device, the circuit block for performing normal operations of the electronic device, wherein the control circuit is configured to control the external connector to be coupled to the circuit block and to control the internal connector to be disconnected from the control circuit when the control circuit receives the control signal;

wherein a testing operation is executed in response to a testing signal inputted to the control circuit via the external connector for checking and modifying a status of the circuit block of the electronic device after the external connector is coupled to the control circuit.

2. The integrated circuit of claim 1, wherein the code generated from the user's input is transmitted through one of a plurality of ports of the external connector.

3. The integrated circuit of claim 1, wherein the testing signal is generated by the user and inputted via at least one of a plurality of ports of the external connector for checking and modifying the status of the circuit block of the electronic device.

4. The integrated circuit of claim 1, wherein the monitor circuit comprises:

a decoding circuit, configured to decode the code generated from the user's input and inputted via the external connector to generate a decoded code; and a generating circuit, arranged to generate the control signal to the control circuit according to the decoded code.

5. The integrated circuit of claim 1, wherein the external connector corresponds to High Definition Multimedia Interface (HDMI), Universal Serial Bus (USB), USB-type C, Personal Computer Memory Card International Association (PCMCIA), Sony/Philips Digital Interface Format (S/Pdif) out, or Ethernet.

6. A method for testing an electronic device comprising an external connector and an internal connector, comprising:

monitoring a code generated externally from a user's input and only inputted via the external connector and generating a control signal according to the code;

controlling the external connector to be coupled to a control circuit and controlling the internal connector to be disconnected from the control circuit when the control signal is received, wherein the control circuit is coupled to at least a circuit block of the electronic device, the circuit block for performing normal operations of the electronic device; and executing a testing operation in response to a testing signal inputted to the control circuit via the external connector for checking and modifying a status of the circuit block of the electronic device after the external connector is coupled to the control circuit.

7. The testing method of claim 6, wherein the code generated from the user's input is transmitted through one of a plurality of ports of the external connector.

8. The testing method of claim 6, wherein the testing signal is generated by the user and inputted via at least one of a plurality of ports of the external connector for checking and modifying the status of the circuit block of the electronic device.

9. The testing method of claim 6, the external connector corresponds to High Definition Multimedia Interface (HDMI), Universal Serial Bus (USB), USB-type C, Personal Computer Memory Card International Association (PCMCIA), Sony/Philips Digital Interface Format (S/Pdif) out, or Ethernet.

10. An electronic device, comprising:

at least a circuit block for performing normal operations of the electronic device;

an external connector;

an internal connector; and a testing integrated circuit, comprising:

a monitor circuit, coupled to the external connector, wherein the monitor circuit is configured to monitor a code generated externally from a user's input and only inputted via the external connector, the monitor circuit generating a control signal according to the code; and a control circuit, coupled to the monitor circuit and the circuit block of the electronic device, wherein the control circuit is configured to control the external connector to be coupled to the control circuit and control the internal connector to be disconnected from the control circuit when the control circuit receives the control signal;

wherein a testing operation is executed in response to a testing signal inputted to the control circuit via the external connector for checking and modifying a status of the circuit block of the electronic device after the external connector is coupled to the control circuit.

11. The electronic device of claim 10, wherein the code generated from the user's input is transmitted through one of a plurality of ports of the external connector.

12. The electronic device of claim 10, wherein the testing signal is generated by the user and inputted via at least one of a plurality of ports of the external connector for checking and modifying the status of the circuit block of the electronic device.

13. The electronic device of claim 10, wherein the monitor circuit comprises:

a decoding circuit, configured to decode the code generated from the user's input and inputted via the external connector to generate a decoded code; and a generating circuit, arranged to generate the control signal to the control circuit according to the decoded code.

14. The electronic device of claim 10, wherein the external connector corresponds to High Definition Multimedia Interface (HDMI), Universal Serial Bus (USB), USB-type C, Personal Computer Memory Card International Association (PCMCIA), Sony/Philips Digital Interface Format (S/Pdif) out, or Ethernet.

* * * * *